United States Patent
Tada et al.

(10) Patent No.: US 7,880,180 B2
(45) Date of Patent: Feb. 1, 2011

(54) COMPOSITE SEMICONDUCTOR DEVICE AND METHOD OF MANUFACTURING THE SAME

(75) Inventors: Yasuhiro Tada, Tokyo (JP); Akihiko Hanya, Tokyo (JP)

(73) Assignee: Stanley Electric Co., Ltd., Tokyo (JP)

(*) Notice: Subject to any disclaimer, the term of this patent is extended or adjusted under 35 U.S.C. 154(b) by 308 days.

(21) Appl. No.: 11/761,080

(22) Filed: Jun. 11, 2007

(65) Prior Publication Data

US 2007/0284566 A1 Dec. 13, 2007

(30) Foreign Application Priority Data

Jun. 12, 2006 (JP) .............. 2006-162534

(51) Int. Cl.
*H01L 29/18* (2006.01)
(52) U.S. Cl. .............. 257/88; 257/79; 257/80; 257/81; 257/82; 257/83; 257/89; 257/95; 257/98; 257/99; 257/100
(58) Field of Classification Search ............. 257/79–83, 257/88–89, 95, 98–100
See application file for complete search history.

(56) References Cited

U.S. PATENT DOCUMENTS 6,333,522 B1  12/2001  Inoue et al.
7,180,240 B2 *  2/2007  Noguchi et al. ............. 313/512
2003/0132446 A1 *  7/2003  Guenther et al. ............. 257/88
2005/0139846 A1 *  6/2005  Park et al. .................... 257/98
2006/0060867 A1 *  3/2006  Suehiro ........................ 257/81
2006/0180818 A1 *  8/2006  Nagai et al. .................. 257/89

FOREIGN PATENT DOCUMENTS

| JP | 11307818 | 11/1999 |
| JP | 3298390 | 4/2002 |
| JP | 2004079933 | 3/2004 |
| WO | WO9834285 | 8/1998 |

* cited by examiner

*Primary Examiner*—David Vu
*Assistant Examiner*—Brandon Fox
(74) *Attorney, Agent, or Firm*—Kenealy Vaidya LLP

(57) ABSTRACT

The disclosed subject matter provides a composite semiconductor device which can include a common substrate, a first semiconductor light emitting structure, and a second semiconductor light emitting structure. The first semiconductor light emitting structure can include an epitaxial grown layer containing a light emitting layer formed on part of the common substrate either directly or via a bonding layer. The second semiconductor light emitting structure can be provided in a notch at at least one location to which the epitaxial grown layer is not bonded, or in a recess formed in the notch at one location. The disclosed subject matter also provides a method of manufacturing a composite semiconductor device having the above-described and other structures.

25 Claims, 7 Drawing Sheets

Surface Mount Package

FIG. 12

Bullet-shaped Package

COMPOSITE SEMICONDUCTOR DEVICE AND METHOD OF MANUFACTURING THE SAME

This application claims the priority benefit under 35 U.S.C. §119 of Japanese Patent Application No. 2006-162534 filed on Jun. 12, 2006, which is hereby incorporated in its entirety by reference.

BACKGROUND

1. Field

The present disclosed subject matter relates to a semiconductor composite device and method of manufacturing the same. More particularly, it relates to a composite semiconductor device including a plurality of light emitting units on the same substrate and method of manufacturing the same.

2. Description of the Related Art

There have been proposed semiconductor light emitting sources which include a plurality of light emitting units with respective different emission spectra and which are formed on the same substrate composed of a semiconductor material or on the same device. These conventional are devices are described as follows: (1) a semiconductor composite light emitting device which includes semiconductor crystal layers having a plurality of active layers (light emitting layers) with different respective emission spectra that are sequentially grown on the same substrate (see, for example, Patent Document 1: JP Patent No. 3298390); (2) an LED display which includes semiconductor crystal layers having light emitting layers with different respective emission spectra that are sequentially or simultaneously grown on the same substrate (see, for example, Patent Document 2: JP 2004-79933A); (3) a semiconductor light emitting device which includes a GaN-based LED mounted facedown on an Si diode via micro-bumps (see, for example, Patent Document 3: WO 98/34285); and (4) a full-color semiconductor light emitting device which includes semiconductor light emitting devices of the flip-chip type that are operative to emit red, green and blue lights and which are mounted on an Si diode via micro-bumps (see, for example, Patent Document 4: JP 11-307818A).

In the above-listed conventional art document (1), an increase in the number of the light emitting layers extensively increases the steps in the epitaxial growth process. This results in an elongated lead-time, with a lowered producibility and an increased production cost, and also makes it difficult to insure excellent reproducibility on respective growth conditions in all growth processes. Therefore, the light emitting layers cause variations in emission spectra and thus the exit light from the resultant composite semiconductor light emitting device exhibits a large variation in color tone, which makes it difficult to control color tone.

In the above-listed conventional art document (2), the composition ratio and growth temperature associated with the compound semiconductor may be controlled to form the light emitting layers having a plurality of desired emission spectra selectively in order or at the same time. In this case, a highly precise execution of selective composition control and temperature control are required for growth regions for use in formation of the light emitting layers therein, which also requires the use of high technology products and methods. Therefore, it is difficult for this method to be used to realize an LED display with less variation in color tone.

In the above-listed conventional art document (3), if the LED mounted on the Si diode has an upper electrode that is wire bonded, the heat, pressure and vibrations on the wire bonding apply a stress on the micro-bumps that connect the Si diode with the LED. This stress impairs the reliability of the connection strength and electrical properties. Therefore, the LED is limited to one that has a structure capable of facedown mounting, which restricts the flexibility of LED selection. In addition, suppression of the load imposed on the LED and the Si diode on mounting the LED requires a certain restriction on the mount condition. In this case, the bonding strength between devices may become lower to possibly deteriorate the reliability of the device.

In the above-listed conventional art document (4), the semiconductor light emitting devices are mounted independently. Therefore, the interval between adjacent devices is extended which can deteriorate the color mixture properties of the device.

SUMMARY

The disclosed subject matter has been made in consideration of the above described characteristics, deficiencies, problems and features of the above described conventional art and can include providing a composite semiconductor device that is excellent in heat radiation, color mixture, quality, stability and reliability, with higher brightness and larger flexibility in the selection of the light emitting devices for mounting.

In accordance with an aspect of the disclosed subject matter, a composite semiconductor device can include: a common substrate; a first semiconductor light emitting device; and a second semiconductor light emitting device, wherein the first semiconductor light emitting device is structured to include an epitaxial grown layer containing a light emitting layer formed on part of the common substrate directly or via a bonding layer, and wherein the second semiconductor light emitting device is provided in a notch at one location at least to which the epitaxial grown layer is not bonded or in a recess formed in the notch at one location at least.

In accordance with another aspect of the disclosed subject matter, the second semiconductor light emitting device may include an epitaxial grown layer containing a light emitting layer formed on a grown substrate that is different from the common substrate, and is bonded to the common substrate via a bonding electrode.

In yet another aspect of the disclosed subject matter, the bonding layer in the first semiconductor light emitting device may include an ohmic electrode layer and a bonding material layer composed of a metal, and can be formed in contact with the epitaxial grown layer in the first semiconductor light emitting device.

In another aspect of the disclosed subject matter, the bonding electrode for bonding the second semiconductor light emitting device may be formed in the notch on the common substrate in part, or all continuously, or separately, from the bonding layer in the first semiconductor light emitting device.

In still another aspect of the disclosed subject matter, the first semiconductor light emitting device and the second semiconductor light emitting device may have different respective emission spectra.

In another aspect of the disclosed subject matter, the composite semiconductor device may further include a light transmissive resin containing at least one kind of wavelength conversion material, such as a phosphor, filled in at least one recess in which the second semiconductor light emitting device is provided.

The disclosed subject matter also relates to a method of manufacturing a composite semiconductor device, that can include: forming an epitaxial grown layer containing a light emitting layer on a grown substrate; forming a first electrode on the epitaxial grown layer; forming a second electrode and a third electrode on both surfaces of a common substrate, respectively; bonding the first electrode and the second electrode together; forming a fourth electrode on a surface of the bonded assembly near the epitaxial grown layer after removing or not removing the grown substrate from the bonded assembly to form a first semiconductor light emitting device; forming a notch at one location or more extending from the epitaxial grown layer in the first semiconductor light emitting device to at least one of the first electrode, the second electrode, and/or the common substrate, or further forming a recess in the notch extended to the common substrate; forming a fifth electrode on an inner bottom of the notch or the recess; and, mounting a second semiconductor light emitting device in the notch or the recess.

In accordance with the disclosed subject matter, it can be possible to realize a composite semiconductor device that is excellent in heat radiation, color mixture, quality, stability and/or reliability, and which has higher brightness and larger flexibility in the selection of light emitting devices for mounting.

DETAILED DESCRIPTION OF EXEMPLARY EMBODIMENTS

Exemplary embodiments of the disclosed subject matter will now be described in detail below with reference to FIGS. 1-15. The below-described embodiments are specific examples of the disclosed subject matter and are given various technical features. However, the scope of the disclosed subject matter is not limited to these embodiments.

Figure 1:
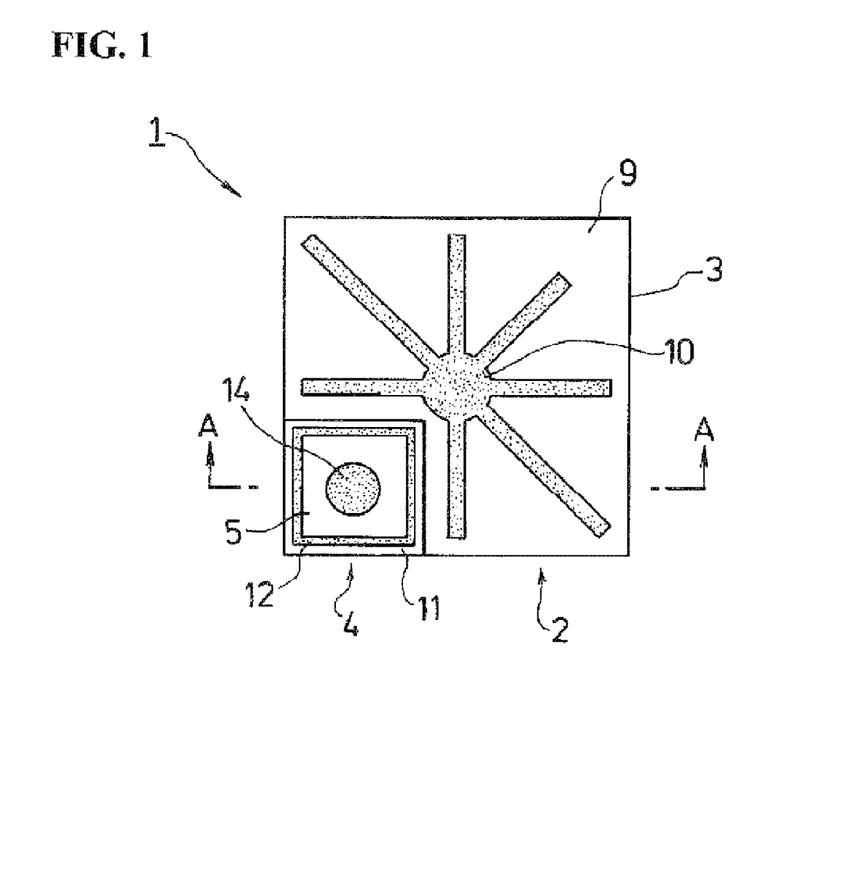
FIG. 1 is a plan view of an embodiment of a composite semiconductor device made in accordance with principles of the disclosed subject matter.
Figure 2:
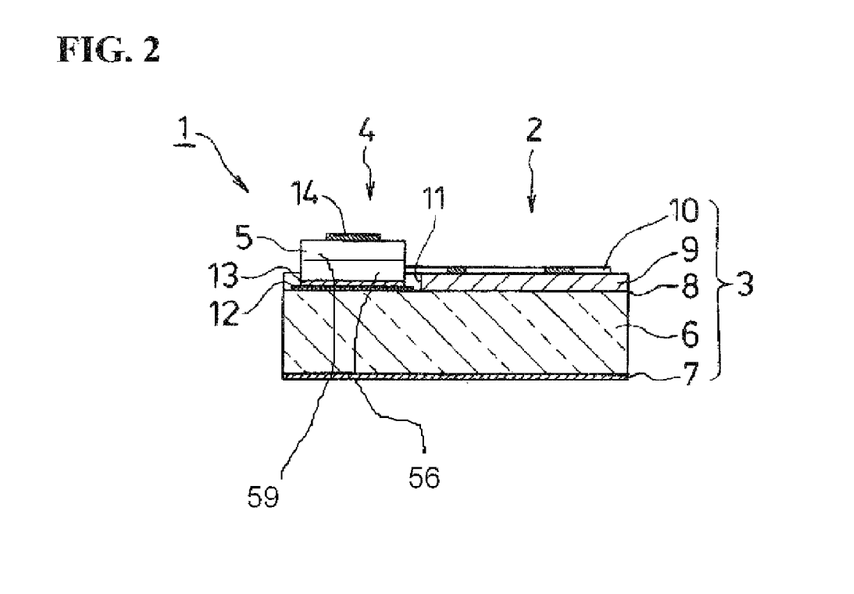
FIG. 2 is a cross-sectional view taken along line A-A of FIG. 1.

FIG. 1 is a plan view of an embodiment of a composite semiconductor device made in accordance with principles of the disclosed subject matter, and FIG. 2 is a cross-sectional view taken along line A-A of FIG. 1.

The composite semiconductor device (hereinafter abbreviated as "composite device") 1 can include a first semiconductor light emitting device (hereinafter abbreviated as "first light emitting device") 3 for configuring a first light emitting region 2, and a second semiconductor light emitting device (hereinafter abbreviated as "second light emitting device") 5 for configuring a second light emitting region 4.

The first light emitting device 3 can be configured as follows. A material is appropriately selected from Si, $Al_2O_3$, SiC and GaP having desired properties (such as high electric conductivity, high transmissivity, high thermal conductivity and high strength) to form a common substrate 6. A first external connection electrode 7 is formed on one surface of the common substrate 6. The first external connection electrode 7 includes a wet layer of Ti or Ni and an external connection electrode layer of Au in order from the common substrate 6.

On the other surface of the common substrate 6, a later-described bonding layer 8, an epitaxial grown layer (hereinafter abbreviated as "grown layer") 9 containing a light emitting layer, and a second external connection electrode 10 composed of an AuGeNi alloy are formed in order from the common substrate 6. The second external connection electrode 10 serves as a light-exit surface and accordingly may be composed of a fine wire electrode or an entirely transparent electrode that does not block the exit of light as much as possible.

On the common substrate 6, a notch 11 is formed without the grown layer 9 formed therein. The notch 11 is a region where the second external connection electrode 10 and the grown layer 9 are not present. A light emitting device bonding electrode 12 is formed on the common substrate 6 exposed through the bottom of the notch 11 for mounting and bonding the second light emitting device 5. The light emitting device bonding electrode 12 can be composed of Au or AuZn, for example, to insure excellent electric conductivity.

A eutectic bond between a lower electrode 13 on the second light emitting device 5 and the light emitting device bonding electrode 12 formed in the notch 11 on the common substrate 6 fixes the second light emitting device 5 in the notch 11. It also achieves electric conduction between both electrodes. The second light emitting device 5 has an upper electrode 14 formed on the other side opposite the lower electrode 13. In addition, the second light emitting device 5 can include a grown substrate 56 located adjacent an epitaxial grown layer 59. It should be noted that various adhesive, conductive, transmissive, or other layers can be interposed between the layers disclosed in the specific embodiments herein without departing from the spirit and scope of the disclosed subject matter.

Figure 3:
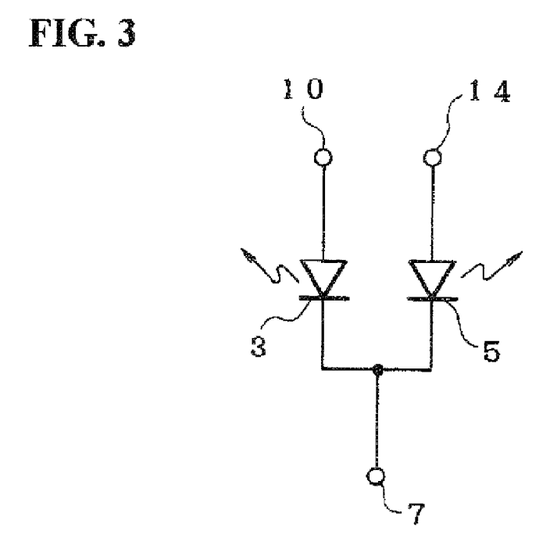
FIG. 3 is an exemplary internal wiring diagram for the embodiment of FIG. 1.
Figure 4:
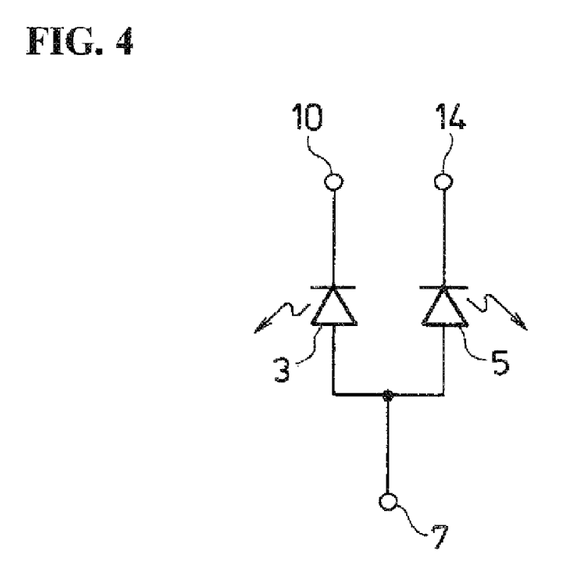
FIG. 4 is another exemplary internal wiring diagram for the embodiment of FIG. 1.

The composite semiconductor device 1 configured as described above can be internally wired in both ways as shown FIGS. 3 and 4. If the device 1 is wired as shown in FIG. 3, the first light emitting device 3 is configured such that the first external connection electrode 7 serves as the N-electrode and the second external connection electrode 10 serves as the P-electrode. In this case, the second light emitting device 5 is configured such that the lower electrode 13 serves as the N-electrode and the upper electrode 14 serves as the P-electrode.

On the other hand, if the device 1 is wired as shown in FIG. 4, the first light emitting device 3 is configured such that the first external connection electrode 7 serves as the P-electrode and the second external connection electrode 10 serves as the N-electrode. In this case, the second light emitting device 5 is configured such that the lower electrode 13 serves as the P-electrode and the upper electrode 14 serves as the N-electrode.

Figure 5:
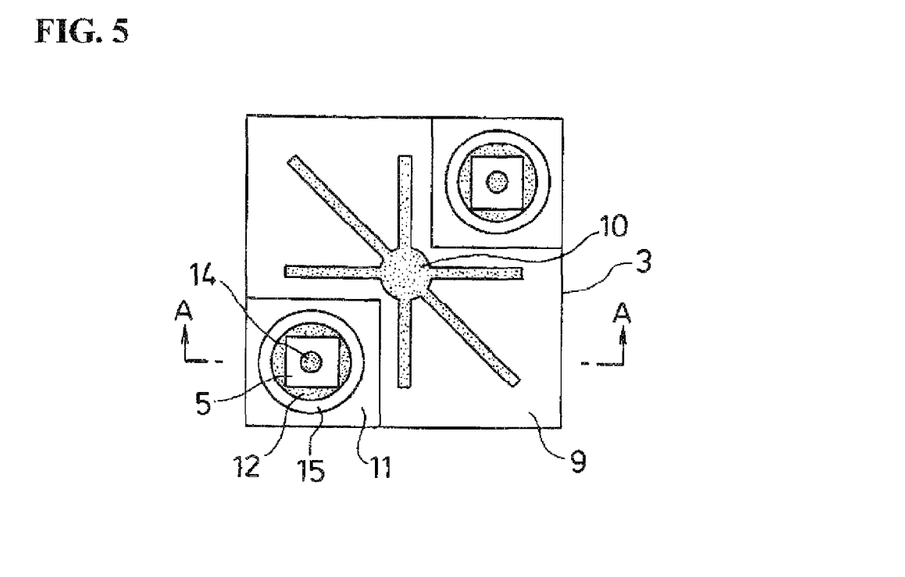
FIG. 5 is a plan view of another embodiment of a composite semiconductor device made in accordance with principles of the disclosed subject matter.
Figure 6:
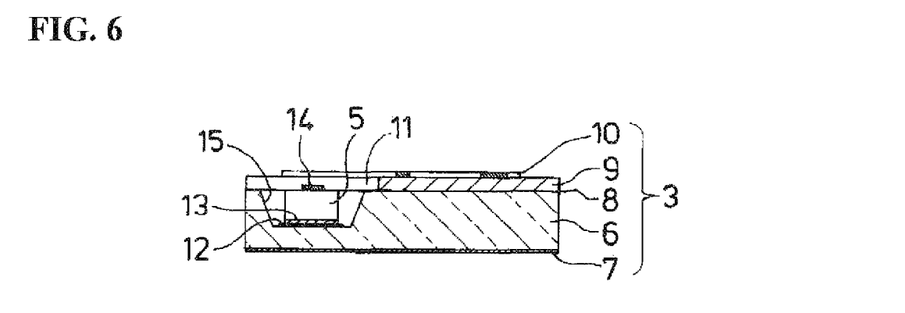
FIG. 6 is a cross-sectional view taken along line A-A of FIG. 5.
Figure 7:
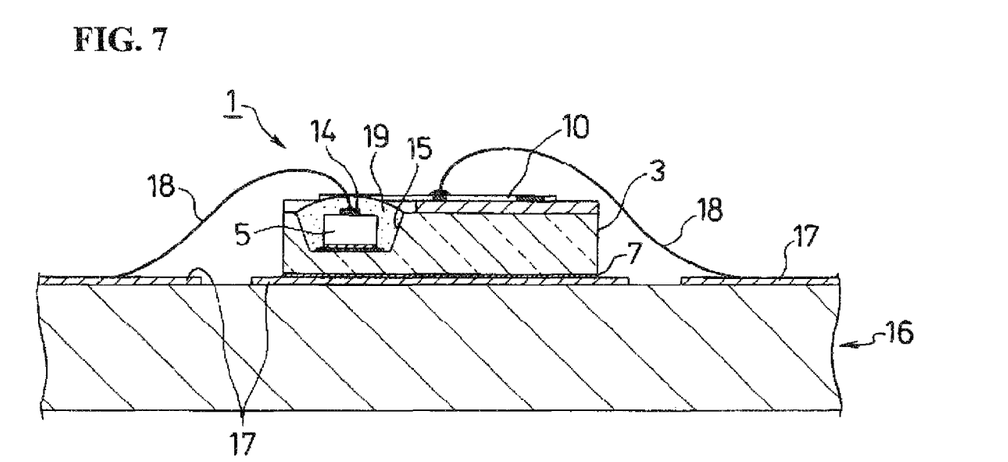
FIG. 7 is a cross-sectional side view of the embodiment of FIG. 5 when mounted.

FIG. 5 is a plan view of another embodiment of a composite semiconductor device made in accordance with principles of the disclosed subject matter. FIG. 6 is a cross-sectional view taken along line A-A of FIG. 5, and FIG. 7 is a side view of the device when mounted.

In the embodiment of FIG. 5, notches 11 are formed at two opposite locations on the common substrate 6. The notches 11 are formed without the presence of the second external connection electrode 10 and the grown layer 9 in the first light emitting device 3. A recess 15 is formed in the common substrate 6 that is exposed through the bottom of each notch 11.

A second light emitting device bonding electrode 12 is formed on the inner bottom of the recess 15. A eutectic bond between the lower electrode 13 on the second light emitting device 5 and the bonding electrode 12 fixes the second light emitting device 5 in the recess 15 and also achieves electric conduction between both electrodes.

The remaining structures can be substantially similar to those in the above embodiment of FIG. 1, and therefore a detailed description thereof is omitted from the following description.

FIG. 7 shows the composite semiconductor device 1 of FIG. 5 mounted on a motherboard. The composite semiconductor device 1 is fixed on the motherboard 16 such that the first external connection electrode 7 on the composite semiconductor device 1 is bonded to wiring patterns 17 on the motherboard 16 via a conductive bonding material such as a solder and a conductive adhesive (not shown). These electrodes are brought into electrical conduction with each other.

The second external connection electrode 10 on the first light emitting device 3 and the upper electrode 14 on the second light emitting device 5 are connected to a separate portion of the wiring patterns 17 on the motherboard 16 via respective bonding wires 18.

The recess 15, in which the second light emitting device 5 is mounted, is filled with a sealing resin 19 composed of a light transmissive resin that can include at least one kind of wavelength conversion material such as a phosphor to seal the second light emitting device 5. The light transmissive resin configuring the sealing resin 19 protects the second light emitting device 5 from external environments such as water, dirt, gases, etc. The refractive index of the sealing resin 19, which forms an interface with the light-exit surface of the second light emitting device 5, may be made closer to the refractive index of the semiconductor material, which forms the light-exit surface of the second light emitting device 5. In this case, it is possible to improve the efficiency of extracting the emitted light traveling from the light-exit surface of the second light emitting device 5 into the sealing resin 19.

In operation, a phosphor contained in the sealing resin 19 is excited by a part of the light emitted from the second light emitting device 5 and thus converts the emitted light into a light with a longer wavelength than the emitted light. With an additional color mixture of the emitted light with the converted light, it is operative to release a light with a different chromaticity from that of the light emitted from the second light emitting device 5. Consequently, an appropriately selected combination of the light from the first light emitting device 3, the light from the second light emitting device 5, and the phosphor can realize a composite semiconductor device 1 that emits a light with a desired chromaticity.

It is further possible to seal the composite semiconductor device 1 and the bonding wires 18 in a sealing resin composed of a light transmissive resin. In this case, the sealing resin protects the composite semiconductor device 1 from external environments such as water, dirt, gases, etc., similar to the above, and also protects the bonding wires 18 from mechanical stresses such as vibrations and impacts. In addition, the sealing resin can also function to efficiently lead the light that is released from the composite semiconductor device 1 and into the light transmissive resin through the light-exit surface of the composite semiconductor device 1.

Figure 8:
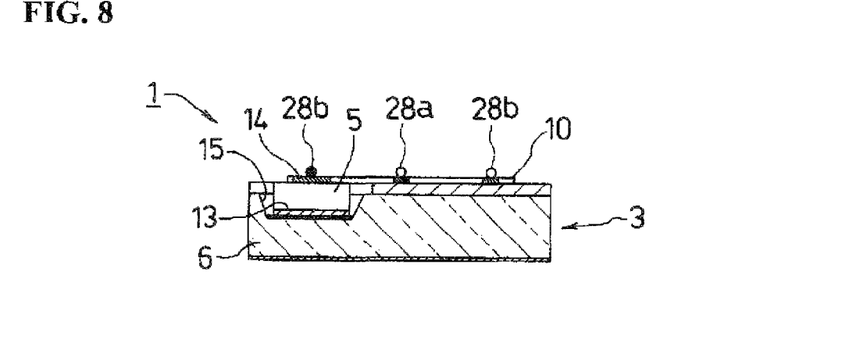
FIG. 8 is a cross-sectional side view of another embodiment of a composite semiconductor device made in accordance with principles of the disclosed subject matter.
Figure 9:
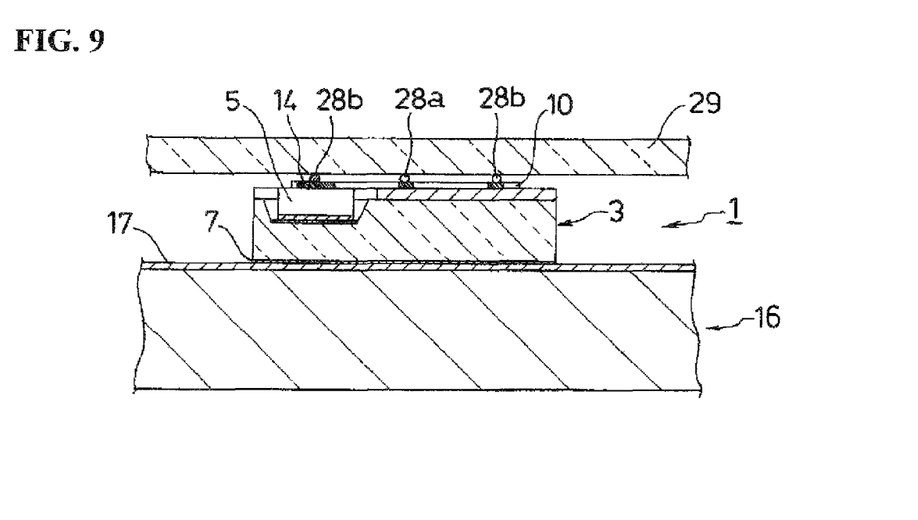
FIG. 9 is a cross-sectional side view of the embodiment of FIG. 8 when mounted.
Figure 10:
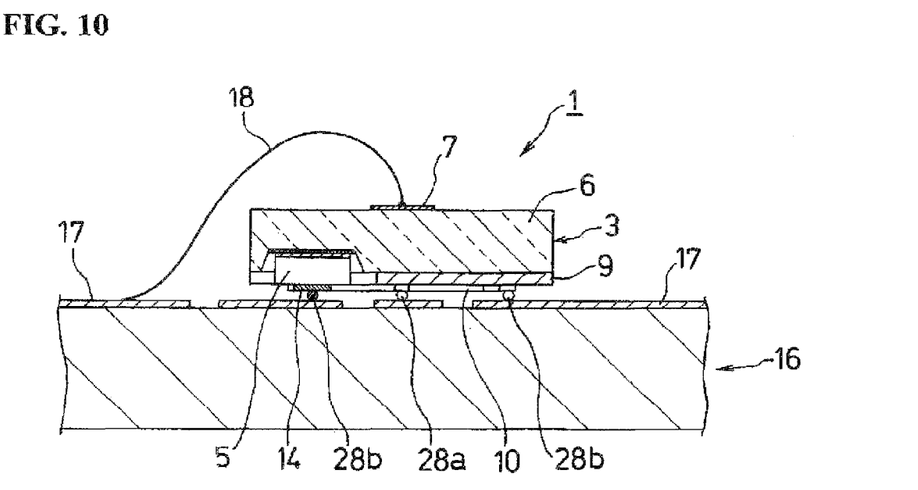
FIG. 10 is a cross-sectional view of the embodiment of FIG. 8 when mounted in another configuration.

FIG. 8 is a cross-sectional view of another embodiment of a composite semiconductor device made in accordance with principles of the disclosed subject matter, and FIGS. 9 and 10 are side views of the device when mounted.

In the embodiment of FIG. 8, the second external connection electrode 10 on the first light emitting device 3 and the upper electrode 14 on the second light emitting device 5 have respective upper surfaces located on the same or substantially same plane, which is different from the above-described embodiments. In order to ensure the positional relation between the electrodes 10 and 14, the first light emitting device 3 is fabricated such the thickness of the first light emitting device 3 is thicker than the thickness of the second light emitting device 5. In addition, the depth of the recess 15 that is formed in the common substrate 6 is determined in consideration of the thickness of the second light emitting device 5.

A spacer structure such as a bump ball 28a composed of Au or the like is formed on the second external connection electrode 10 and another spacer structure such as bump ball 28b similarly composed of Au or the like is formed on the second light emitting device 5. The bump balls 28a and 28b have respective upper ends located on the same or substantially the same plane.

In FIG. 8 the pair of electrodes on the second light emitting device 5 are composed of the upper electrode 14 and the lower electrode 13. Both of the pair of electrodes may be provided on the upper side of the second light emitting device 5. In this case, the upper surfaces of the two electrodes provided on the upper side of the second light emitting device 5 and the upper surface of the second external connection electrode 10 on the first light emitting device 3 can be located on the same or substantially the same plane.

Other structures of the device 1 can be the same or similar to those in the above described embodiment of FIG. 5 and a detailed description is therefore omitted from the following description.

FIG. 9 shows the composite semiconductor device of the embodiment of FIG. 8 mounted in a sandwiched configuration between a motherboard and a transparent substrate. The composite semiconductor device 1 is fixed on the motherboard 16 such that the first external connection electrode 7 on the composite semiconductor device 1 is bonded to wiring patterns 17 on the motherboard 16 via a conductive bonding material such as a solder and a conductive adhesive (not shown). These electrodes are brought into electrical conduction with each other. The bump ball 28a on the first light emitting device 3 and the bump ball 28b on the second light emitting device 5 are bonded to wiring patterns (not shown) formed on the transparent substrate 29 and brought into electrical conduction with each other.

The light emitted from both the first light emitting device 3 and the second light emitting device 5 is released through the transparent substrate 29 to an area outside of the transparent substrate 29. A variety of processing (such as lens processing and diffusion processing) may be performed on the transparent substrate 29 in accordance with a desired device characteristic.

Such a mounting method is possible because the second external connection electrode 10 on the first light emitting device 3 and the upper electrode 14 on the second light emitting device 5 have respective upper surfaces located on the same plane. In addition, the bump ball 28a provided on the second external connection electrode 10 on the first light emitting device 3 and the bump ball 28b provided on the upper electrode 14 on the second light emitting device 5 have respective upper ends located on the same plane.

FIG. 10 shows the composite semiconductor device of the embodiment of FIG. 8 mounted on a motherboard 16. The composite semiconductor device 1 is fixed on the motherboard 16 for electrical conduction such that the bump ball 28a on the first light emitting device 3 and the bump ball 28b on the second light emitting device 5 are bonded to respective wiring patterns 17 on the motherboard 16.

The first external connection electrode 7 can be partly formed on the first light emitting device 3 and bonded via a bonding wire 18 to another wiring pattern 17 for electrical conduction. The portion of the wiring patterns 17 to which the bonding wire 18 is attached can be separate from those portions of the wiring patterns 17 bonded to the bump balls 28a, 28b on the motherboard 16.

In this case, the common substrate 6 in the first light emitting device 3 is composed of a semiconductor material having light transmissivity. Therefore, of the light emitted from inside the epitaxial grown layer 9, a portion of the light traveling toward the first external connection electrode 7 is released through the common substrate 6 to an area outside of the common substrate 6. In addition, a portion of the light traveling toward the motherboard 16 is reflected at the surface of the motherboard 16 and similarly released through the common substrate 6 to an area outside of the common substrate 6.

Accordingly, this particular example of the mounting method can enhance the efficiency of extraction of the emitted light. The light extraction efficiency can be further enhanced by providing a reflecting layer, for example, printed on a surface of the motherboard 16 on which the composite semiconductor device 1 is mounted.

Such a mounting method is possible because the second external connection electrode 10 on the first light emitting device 3 and the upper electrode 14 on the second light emitting device 5 have respective upper surfaces that are located on the same plane. In addition, the bump ball 28a provided on the second external connection electrode 10 on the first light emitting device 3 and the bump ball 28b provided on the upper electrode 14 on the second light emitting device 5 have respective upper ends located on the same plane.

Figure 11:
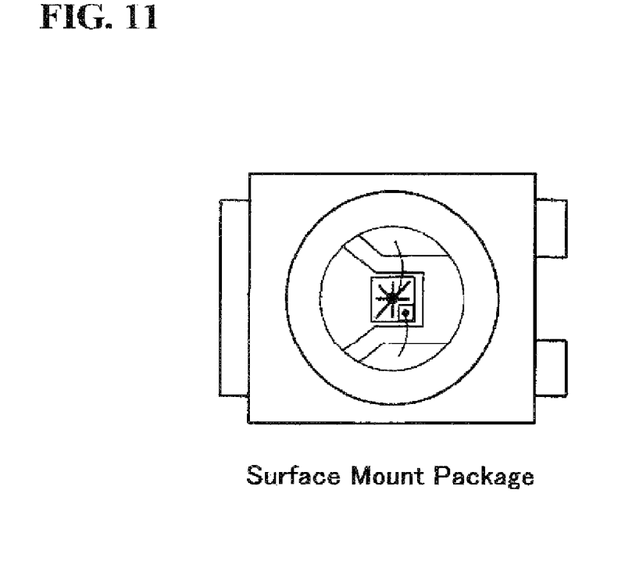
FIG. 11 is a top view of a composite semiconductor device made in accordance with principles of the disclosed subject matter.
Figure 12:
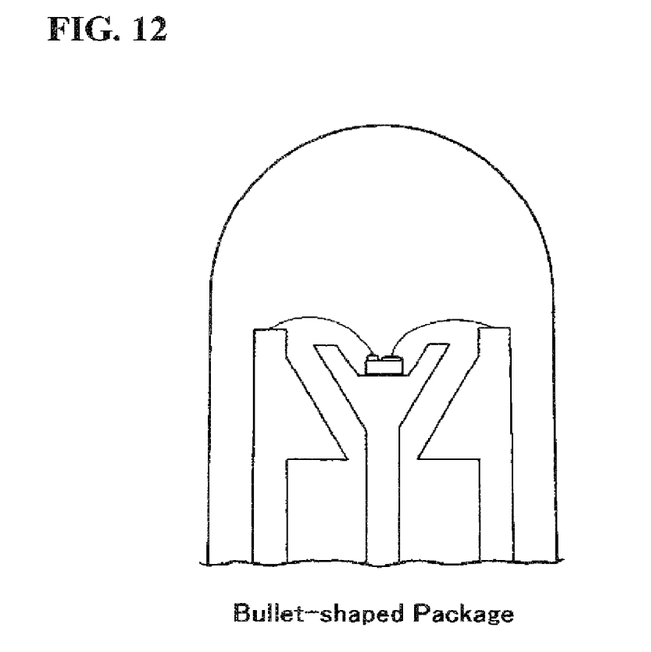
FIG. 12 is a side view of another composite semiconductor device made in accordance with principles of the disclosed subject matter.

The composite semiconductor device 1 of the disclosed subject matter can be mounted in a generally usable package. For example, the device can include a surface mount package as shown in FIG. 11 or a bullet-shaped package as shown in FIG. 12.

Figure 13A:
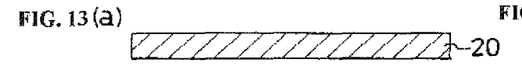
FIGS. 13(a)-(n) show process views related to an exemplary manufacturing process for a composite semiconductor device made in accordance with principles of the disclosed subject matter.

An exemplary method of manufacturing a semiconductor light emitting device in accordance with principles of the disclosed subject matter is described next with reference to FIGS. 13(a)-(n). First, in the FIG. 13(a), a grown substrate 20 is prepared. The grown substrate 20 is composed of a material having a lattice constant that can match that of the later-described epitaxial grown material. If a light emitting layer for red light emission is formed, a GaAs-based semiconductor is employed.

Figure 13B:
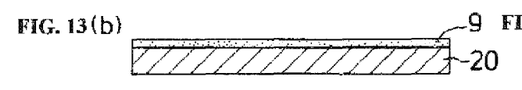

In FIG. 13(b), an epitaxial grown layer 9 containing a light emitting layer is formed on the grown substrate 20. The epitaxial grown layer 9 may be manufactured from an AlGaInP-based semiconductor.

Figure 13C:
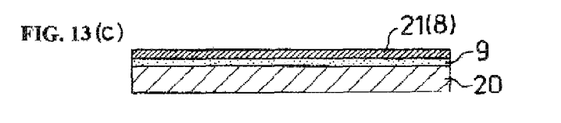
Figure 13D:
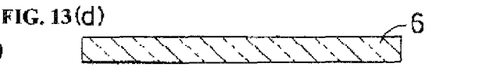

In FIG. 13(c), a first electrode 21 is formed on the epitaxial grown layer 9. The first electrode includes an ohmic electrode layer of AuZn or Au, etc., and a bonding material layer composed of a eutectic material such as AuSn and becomes a part of the bonding layer 8 as shown in FIG. 13(d). In this case, a reflecting layer of $SiO_2$ may be provided partly on a side of the first electrode 21 against the epitaxial grown layer 9.

In FIG. 13(d), aside from the process shown in FIGS. 13(a)-(c), a common substrate 6 is prepared. The common substrate 6 may be manufactured of a Si-based semiconductor. In this case, the material is not limited to the Si-based semiconductor so long as it is higher in thermal conductivity and better in electrical conductivity than the GaAs-based grown substrate 20, for example. Further, a material having desired properties (such as high electric conductivity, high transmissivity, high thermal conductivity and high strength) may be selected from $Al_2O_3$, SiC and GaP for the use in accordance with the targeted composite semiconductor device.

Figure 13E:
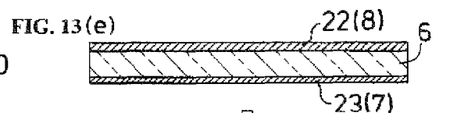

Further, in FIG. 13(e), a second electrode 22 that is to be turned into a part of the bonding layer 8 is formed on one surface of the common substrate 6 and a third electrode 23 that is to be turned into the first external connection electrode 7 is formed on the other surface. The second electrode 22 includes a wet layer of Ti or Ni and a bonding metal layer of Au formed in order from the common substrate 6. The third electrode 23 includes a wet layer of Ti or Ni and an external connection metal layer of Au formed in order from the common substrate 6.

Next, the grown substrate 20 (after the completion of the processes shown in FIGS. 13(a)-(c)) and the common substrate 6 (after the completion of the processes shown in FIGS. 13(d)-(e)) are assembled.

Figure 13F:
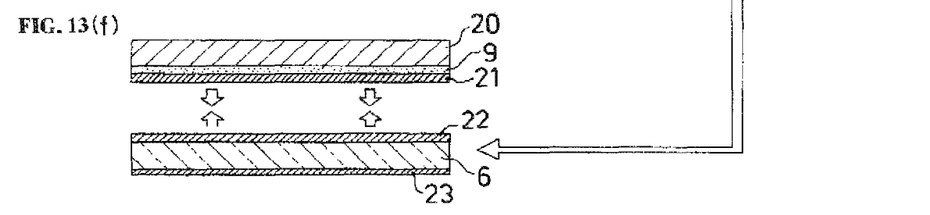

In FIG. 13(f), the first electrode 21 on the grown substrate 20 is opposed to the second electrode 22 on the common substrate 6.

Figure 13G:
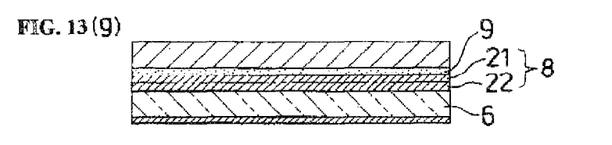
Figure 13H:
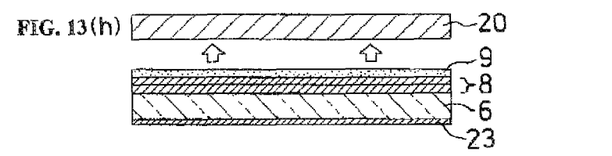
Figure 13I:
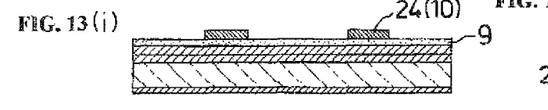
Figure 13J:
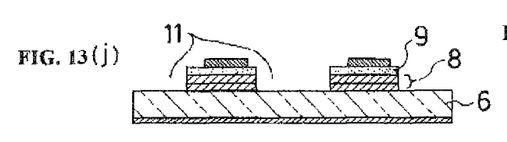
Figure 13K:
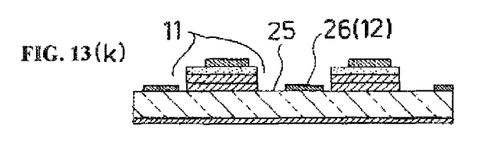
Figure 13L:
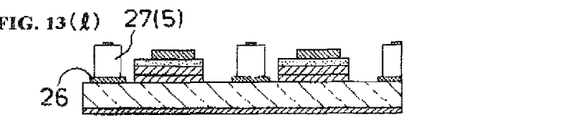
Figure 13M:
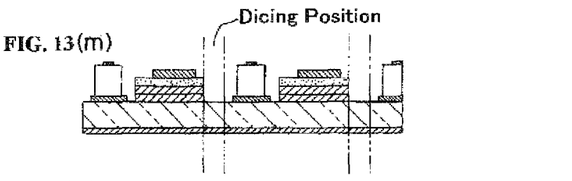
Figure 13N:
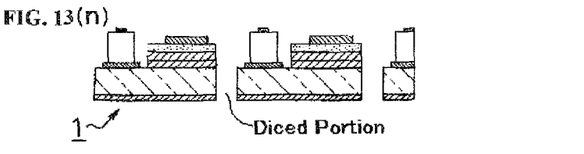

In FIG. 13(g), the first electrode 21 on the grown substrate 20 and the second electrode 22 on the common substrate 6 are brought into contact with each other and heated and pressurized to bond both the electrodes 21 and 22 together. In this case, the bonding layer of AuSn contained in the first electrode 21 and the bonding metal layer of Au contained in the second electrode 22 are mainly molten and mixed such that the bonded portion becomes the bonding layer 8. It is possible to provide layers in accordance with desired light emitting device properties, such as a barrier layer, a light reflecting layer, a wet layer and an intimate contact layer, between the common substrate 6 and the epitaxial grown layer 9. These layers may be previously provided on the first electrode. Further, other than bonding both together via the eutectic material such as AuSn as is shown in the above FIG. 13(g), processes for bonding both together via a solder material, or bonding both together via a resinous adhesive may also be available. Alternatively, bonding both together only by thermal crimping without interposing a metal material therebetween may be available (in this case, the electrodes 21, 22 and the bonding layer 8 are not formed).

In FIG. 13(*h*), the grown substrate 20 is removed through a method of etching or the like. Depending on the composite semiconductor device, this process may not be executed to leave the grown substrate.

In FIG. 13(*i*), a plurality of fourth electrodes 24 composed of AuGeNi or the like which can be turned into the second external connection electrodes 10 are formed at certain positions on the epitaxial grown layer 9 and alloyed.

In FIG. 13(*j*), a plurality of notches 11 having a certain shape and size are formed by etching or the like at certain positions so as to extend from the epitaxial grown layer 9 through the bonding layer 8 to the common substrate 6. The process shown in FIG. 13(*j*) may be executed simultaneously with the removal of the grown substrate 20 shown in FIG. 13(*h*). It is further possible to form recesses into the common substrate. The notch 1 is not always required to reach the common substrate 6 but may be formed to reach the bonding layer 8 located between the epitaxial grown layer 9 and the common substrate 6. In the above FIG. 13(*b*), the epitaxial grown layer 9 may not be previously provided in the region to be turned into the recess, thereby omitting the above process shown in FIG. 13(*j*).

In FIG. 13(*k*), a fifth electrode 26 composed of AuZn or Au or the like which can be turned into the light emitting device bonding electrode 12 is formed on the bottom 25 of each recess 11. In this case, if the notches 11 formed as shown in FIG. 13(*j*) are stopped in the epitaxial grown layer 9 to leave the bonding layer 8 as it is, this process is not required.

In FIG. 13(*l*), a light emitting device 27 which can be turned into the second light emitting device 5 is mounted on the fifth electrode 26 through a method using eutectics or bumps or the like. If a semiconductor light emitting device of the flip-chip type is used as the second semiconductor light emitting device 5 (not shown), the electrode on the semiconductor light emitting device is mounted on the fifth electrode 26 via bumps.

In FIG. 13(*m*), certain dicing positions are set.

In FIG. 13(*n*), the assembly is diced to individual pieces to complete the composite semiconductor device 1. It is also possible to omit the process shown in FIG. 13(*l*) and establish a flow of processes for mounting the light emitting device 27 on the diced individual piece.

The notch 11 for receiving the light emitting device 27 mounted therein may be formed by forming a hole through the subassembly after the process shown in FIG. 13(*c*) is accomplished and at the position for forming the notch 11 therein. Then, this subassembly is bonded with the common substrate 6, thereby forming the notch at the position of the through-hole on the common substrate. In this case, forming of the notch 11 and forming of the fifth electrode 26 can be omitted.

The second light emitting device 5 corresponds to an LED, which is classified in accordance with the structure of the light emitting layer into a simple PN junction structure, a single-hetero (SH) structure, a double-hetero (DH) structure and a quantum well structure. An appropriate light emitting device is selected from those to realize a desired composite semiconductor device 1.

The combination of the first light emitting device 3 and the second light emitting device 5 for configuring the composite semiconductor device 1 may be set arbitrarily or according to certain desires, etc. For example, it is possible to realize a composite semiconductor device capable of emitting a multi-colored light through a combination of light emitting devices having different emission spectra. It is also possible to realize a composite semiconductor device capable of executing light output control and distribution control through a combination of light emitting devices having the same emission spectrum.

The number and arrangement of the second light emitting devices 5 mounted on the common substrate 6 can also be set arbitrarily or according to particular desires. For example, in order to suppress the variation in chromaticity of light from the composite semiconductor device 1, the devices 5 can be arranged at symmetrical positions about the center of the composite semiconductor device 1. The position for providing the notch or the recess is not limited to the corner of the common substrate as shown. The first semiconductor light emitting device 3 can be shaped and sized in accordance with the second light emitting device 5. In particular, it can be formed in a desired shape along the shape of the second light emitting device 5.

Figure 14:
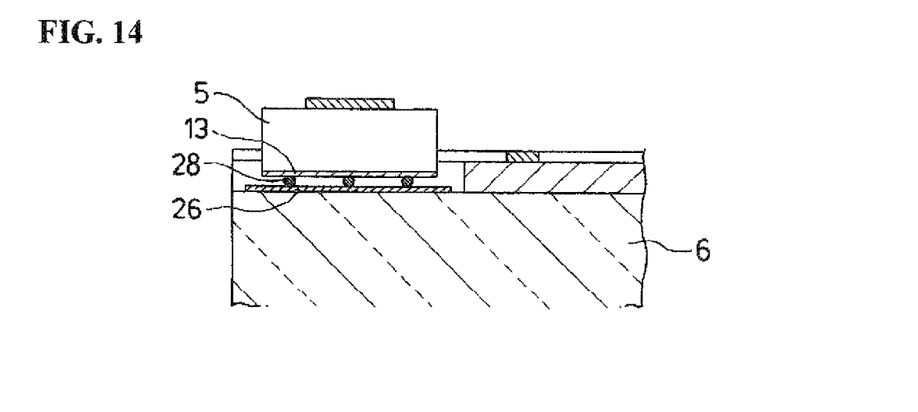
FIG. 14 is a partial cross-sectional view of an embodiment of a composite semiconductor device made in accordance with principles of the disclosed subject matter.

The fifth electrode 26 (light emitting device bonding electrode 12) on the common substrate 6 and the lower electrode 13 on the second light emitting device 5 may be bonded with each other arbitrarily or at certain desired locations. For example, it is possible to perform eutectic bonding or flip-chip mounting with interposition of bump balls 28 of Au or the like as shown in FIG. 14. In particular, from the viewpoint of shortening the distance between the light emitting region in the first light emitting device and the second light emitting device, the use of flip-chip mounting can be used.

The first external connection electrode 7 on the first light emitting device 3 and the lower electrode 13 on the second light emitting device 5 can be of the same conduction type. Therefore, the second external connection electrode 10 on the first light emitting device 3 and the upper electrode 14 on the second light emitting device 5 can be of the same conduction type as well.

The embodiments associated with the semiconductor composition device of the disclosed subject matter and the manufacturing method are described above. The following description is given to describe at least some of the effects exerted by the disclosed subject matter and the embodiments.

(1) Heat Radiation

The second light emitting device (LED) can be mounted on the common substrate composed of a material higher in thermal conductivity than the material (for example, a GaAs-based semiconductor) of the epitaxial grown layer containing a light emitting layer. (If the epitaxial grown layer is composed of the GaAs-based semiconductor, the common substrate is composed of a Si-based semiconductor). Therefore, self-produced heat can be transferred externally efficiently from the LED (for example, to the mounting board), thereby improving the effect on heat radiation, at least more so than the case when the LED is mounted on the epitaxial grown layer,.

(2) Color Mixture

A plurality of light emitting units operative to emit light having different emission spectra may be provided to obtain an arbitrary (or particularly desired) chromaticity light through the additional color mixture of lights from the light emitting units. In this case, in order to ensure an excellent color mixture with less variation in chromaticity, the distance between adjacent light emitting units can be shortened.

As described above, in the disclosed subject matter, the first light emitting device 3 can be shaped and sized in accordance with the second light emitting device 5. In particular, it can be formed in a desired shape that is similar to the shape of the second light emitting device 5. Therefore, this semiconductor composition device of the disclosed subject matter can be fabricated without leaving any useless space between both light emitting devices (between light emitting regions) and thus it is obviously excellent in color mixture.

When a light emitting device is mounted on a substrate, an electrode on the light emitting device and the corresponding electrode of the substrate are connected via either one of a eutectic material, a solder, a bump ball, a conductive paste, etc.

In mounting the light emitting device, high-reflectance, white plastic casing such as a nylon-based material may be used to effectively utilize the light emitted from the light emitting device as illuminative light through the use of the reflection from the plastic casing.

When mounting the light emitting device in the plastic casing, it may be considered to use one of the above eutectic material, the solder, the bump ball, the conductive paste, etc., though, in practice, conditions for use impart restrictions, which leave some of the materials inappropriate.

For example, eutectic bonding of a material such as AuSn generally requires heating at around 280° C. The heat on eutectic bonding also acts on the plastic casing and thermally deteriorates the plastic casing (changes the color to brown or yellow) to lower the reflectance. As a result, the efficiency of extracting the emitted light from the light emitting device lowers and causes a reduction in brightness.

A conductive paste (silver paste) that is configured for use at a temperature lower than the eutectic temperature is employed to avoid such a problem. The conductive paste has a hardening temperature of around 160° C. Therefore, it is possible to ensure high brightness without deteriorating the plastic casing.

Figure 16:
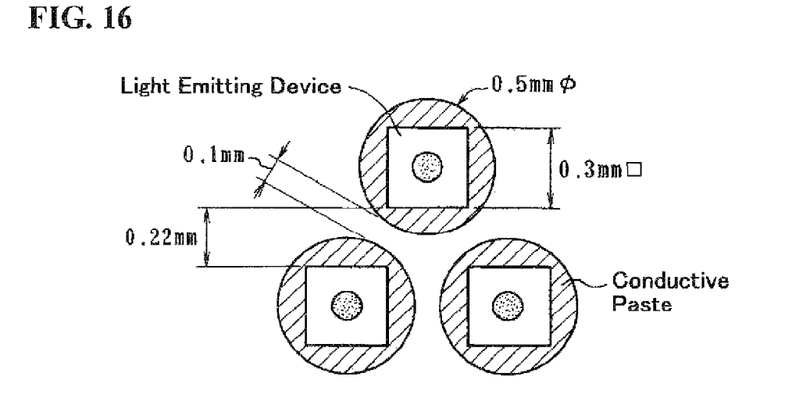
FIG. 16 is a top view of a conventional composite semiconductor device when mounted.

If the conductive paste is used to mount a plurality of individual light emitting devices, the spread of the conductive paste upon mounting is wider than those of other bonding materials and accordingly causes the following problem. Namely, when the light emitting device has a size of 0.3 mm×0.3 mm as shown in FIG. 16, the spread of the conductive paste has a diameter of 0.5 mm. Therefore, if three light emitting devices are located on apexes of a right triangle, respectively, the distance between adjacent conductive pastes may be set at a minimum distance of 0.1 mm to prevent them from short-circuiting. In this case, the distance between adjacent light emitting devices becomes 0.22 mm at a minimum.

Figure 15:
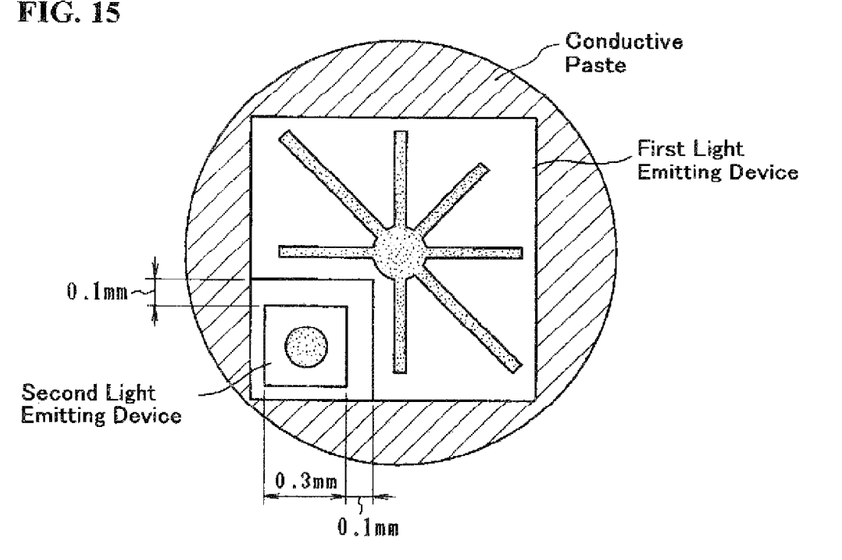
FIG. 15 is a top view of an embodiment of a composite semiconductor device when mounted made in accordance with principles of the disclosed subject matter.

On the other hand, another composite semiconductor device of the disclosed subject matter can be configured as shown in FIG. 15 in which spacer structures such as eutectic material or bump balls can be employed in bonding between the common substrate and the second light emitting device. Namely, if the second light emitting device has dimensions of 0.3 mm×0.3 mm and is mounted on the common substrate through eutectic bonding as described above, the distance between the first light emitting device and the second light emitting device can be 0.1 mm. Further, flip mounting with interposition of bump balls can shorten it to 0.05 mm.

If the light emitting devices as shown in FIGS. 15 and 16 are devices that emit light having different emission spectra, a composite semiconductor device of the disclosed subject matter with a shorter distance between adjacent light emitting devices is obviously better in color mixture.

If a composite semiconductor device of the disclosed subject matter is mounted in the plastic casing, the conductive paste can be used even though a nice color mixture has been already ensured at that moment and, accordingly, the above problem is prevented or not caused.

(3) Quality/Stability

In a composite semiconductor device made in accordance with principles of the disclosed subject matter, the second light emitting device with selected properties such as a particular optical property and electrical property can be mounted on the common substrate. This is different from the direction for forming a plurality of grown layers each containing a light emitting layer on the common substrate as in the conventional art. Accordingly, it is possible to fabricate a composite semiconductor device with less variation in properties and with excellent reproducibility. For example, a combination of a second light emitting device selected in accordance with the emission of light from the light emitting device facilitates the color tone control of the composite semiconductor device.

(4) Flexibility of Selection of Light Emitting Devices

In another composite semiconductor device made in accordance with principles of the disclosed subject matter, the second semiconductor light emitting device can be mounted on the common substrate through methods such as various mounting methods of eutectic bonding and of flip-chip mounting with interposition of bump balls, etc., as described above. In accordance with the methods, the second semiconductor light emitting device may be one of a light emitting device of the type that comprises a pair of electrodes on opposite sides and types that comprise a pair of electrodes on one side. Even if the second semiconductor light emitting device 5 has an upper electrode 14 that requires wire bonding, the reliability of the first semiconductor light emitting device is not impaired. As it is possible to select various mounting methods in this way, the range of usable light emitting devices can be extended so as to increase the flexibility of design and device selection.

(5) High Brightness

A composite semiconductor device made in accordance with principles of the disclosed subject matter may be used to configure a full-color light emitting device. In this case, a green (G) light emitting device is mounted as the first light emitting device on the common substrate, and two devices or a red (R) light emitting device and a blue (B) light emitting device can be configured as the second light emitting devices.

When a white (W) light is formed through additional color mixture of R, G, B lights, it is generally appropriate to use a proportion of the amounts of R, G, B light as R:G:B=3:6:1. The green light requires the largest amount of light.

In the current state, however, green light emitting devices are generally inferior in terms of emission efficiency as compared to other devices. Therefore, a device for emitting white light supplies a larger current to the green light emitting device than to other light emitting devices to keep the amounts of R, G, B lights in balance.

If the red, green and blue light emitting devices have almost the same emission area, the rating current can be determined from the green light emitting device and only a slight current is allowed to flow in the red and blue light emitting devices at that time. Therefore, the white light is of lower brightness even if it can be obtained.

On the contrary, in at least one example of a composite semiconductor device of the disclosed subject matter, as described above, the first light emitting device that is larger in emission area is mounted as the green light emitting device on the common substrate, and two devices (i.e., the red and blue light emitting devices) are smaller in emission area than the green light emitting device to form the second light emitting devices. Therefore, it is possible to increase the amount of the green light while keeping the current density in the emission surface almost unchanged, thereby realizing high brightness while retaining reliability.

A composite semiconductor device of the disclosed subject matter can be formed in the following exemplary configurations: a LCD back light in mobile instruments such as cell phones; a LCD back light in vehicular instruments; a LCD back light in TV and PC monitors; and a light source in various indicators.

While there has been described what are at present considered to be exemplary embodiments of the invention, it will be understood that various modifications may be made thereto, and it is intended that the appended claims cover such modifications as fall within the true spirit and scope of the invention. All conventional art references described above are herein incorporated in their entirety by reference.

What is claimed is:

1. A composite semiconductor device, comprising:
   a common substrate;
   a first semiconductor light emitting structure; and
   a second semiconductor light emitting structure,
   wherein the first semiconductor light emitting structure includes an epitaxial grown layer having a light emitting layer and is located adjacent at least part of the common substrate, and the first semiconductor light emitting structure includes a notch formed in the epitaxial grown layer, wherein the epitaxial grown layer is grown on a first grown substrate which is different than the common substrate, and removed from the first grown substrate,
   wherein the second semiconductor light emitting structure is located in the notch of the epitaxial grown layer;
   wherein the first semiconductor light emitting structure includes a bonding layer located between the common substrate and the epitaxial grown layer, the bonding layer bonding both the common substrate and the epitaxial grown layer together; and
   wherein the bonding layer includes an ohmic electrode layer and a bonding material layer composed of a metal, and the ohmic electrode layer is formed in contact with the epitaxial grown layer.

2. The composite semiconductor device according to claim 1, wherein the second semiconductor light emitting structure includes an epitaxial grown layer having a light emitting layer, the second semiconductor light emitting structure being located adjacent a second grown substrate, the second grown substrate being different from the common substrate, and a bonding electrode is located between the second semiconductor light emitting structure and the common substrate.

3. The composite semiconductor device according to claim 2, wherein the second semiconductor light emitting structure is bonded to the common substrate via the bonding electrode.

4. The composite semiconductor device according to claim 1, wherein the bonding layer includes an eutectic material.

5. The composite semiconductor device according to claim 1, wherein the first semiconductor light emitting structure includes a first bonding layer located adjacent the common substrate, and the second semiconductor light emitting structure includes a bonding electrode located in the notch and adjacent the common substrate, the bonding electrode extending at least one of continuously from and separately from the first bonding layer of the first semiconductor light emitting structure.

6. The composite semiconductor device according to claim 1, wherein the first semiconductor light emitting structure and the second semiconductor light emitting structure have different respective emission spectra.

7. The composite semiconductor device according to claim 1, further comprising:
   a light transmissive resin including at least one kind of wavelength conversion material, the light transmissive resin located in at least one recess in the common substrate in which the second semiconductor light emitting structure is located.

8. The composite semiconductor device according to claim 1, wherein the common substrate includes a recess formed therein, and the second light emitting structure is located in the recess.

9. The composite semiconductor device according to claim 1, further comprising:
   a bonding layer located adjacent the epitaxial grown layer and bonding the epitaxial grown layer to the common substrate.

10. The composite semiconductor device according to claim 1, further comprising:
    at least one of a motherboard and a transparent substrate; and
    a spacer structure located between the common substrate and the at least one of a motherboard and a transparent substrate.

11. The composite semiconductor device according to claim 10, wherein the spacer structure is configured as a bump ball.

12. The composite semiconductor device according to claim 1, wherein the common substrate is conductive.

13. The composite semiconductor device according to claim 1, wherein the epitaxial grown layer is an inorganic semiconductor crystal layer.

14. A light emitting device comprising:
    the composite semiconductor device according to claim 1, and
    a plastic casing,
    wherein the composite semiconductor device is mounted on the plastic casing via a conductive paste.

15. The composite semiconductor device according to claim 1, wherein the common substrate has a higher thermal conductivity than the first grown substrate.

16. The composite semiconductor device according to claim 1, wherein the common substrate has a better electrical conductivity than the first grown substrate.

17. The composite semiconductor device according to claim 1, wherein a distance between the first semiconductor light emitting structure and the second semiconductor light emitting structure is between about 0.05 mm and 0.1 mm.

18. The composite semiconductor device according to claim 1, wherein the second semiconductor light emitting structure includes a plurality of second light emitting structures.

19. The composite semiconductor device according to claim 1, wherein the first semiconductor light emitting structure includes an emission area and the second semiconductor light emitting structure includes an emission area, and
    wherein the emission area of the first light emitting structure is larger than the emission area of the second semiconductor light emitting structure.

20. The composite semiconductor device according to claim 1, further comprising:
    a plurality of second semiconductor light emitting structures,
    wherein the first semiconductor light emitting structure includes an emission area and each of the plurality of the second semiconductor light emitting structures includes an emission area; and
    wherein the emission area of the first semiconductor light emitting structure is larger than the emission area of each of the plurality of the second semiconductor light emitting structures, and the first semiconductor light emitting structure emits green light and at least one of the plurality of the second semiconductor light emitting structures emits red light and at least one of the plurality of the second semiconductor light emitting structures emits blue light.

21. A method of manufacturing a composite semiconductor device, comprising:

forming an epitaxial grown layer including a light emitting layer on a grown substrate;

forming a first electrode on the epitaxial grown layer;

providing a common substrate having a top surface and a bottom surface;

forming a second electrode and a third electrode on the top surface and bottom surface of the common substrate, respectively;

bonding the first electrode and the second electrode together to form a bonded assembly;

forming a fourth electrode on a surface of the bonded assembly adjacent the epitaxial grown layer to form a first semiconductor light emitting structure;

forming a notch at least one location in the epitaxial grown layer in the first semiconductor light emitting structure extending to at least one of the first electrode, the second electrode, and the common substrate;

forming a fifth electrode on an inner bottom of the notch; and mounting a second semiconductor light emitting structure in the notch.

22. The method of manufacturing a composite semiconductor device of claim 21, wherein forming a fourth electrode on a surface of the bonded assembly adjacent the epitaxial grown layer includes removing the grown substrate from the bonded assembly.

23. The method of manufacturing a composite semiconductor device of claim 21, wherein forming a notch includes forming a recess in the common substrate.

24. The method of manufacturing a composite semiconductor device of claim 21, wherein the method is accomplished in a sequential manner.

25. The method of manufacturing a composite semiconductor device of claim 21, further comprising:

providing at least one of a motherboard and a transparent substrate; and attaching the common substrate to the at least one of a motherboard and a transparent substrate via a spacer structure.

* * * * *

UNITED STATES PATENT AND TRADEMARK OFFICE
CERTIFICATE OF CORRECTION

PATENT NO. : 7,880,180 B2
APPLICATION NO. : 11/761080
DATED : February 1, 2011
INVENTOR(S) : Yasuhiro Tada et al.

It is certified that error appears in the above-identified patent and that said Letters Patent is hereby corrected as shown below:

Col. 13, lines 12-34 should read,

1. A composite semiconductor device, comprising:
a common substrate;
a first semiconductor light emitting structure; and
a second semiconductor light emitting structure,
wherein the first semiconductor light emitting structure includes an epitaxial grown layer having a light emitting layer and is located adjacent at least part of the common substrate, and the first semiconductor light emitting structure includes a notch formed in the epitaxial grown layer, wherein the epitaxial grown layer is grown on a first grown substrate, which is different than the common substrate, and removed from the first grown substrate, wherein the second semiconductor light emitting structure is located in the notch of the epitaxial grown layer;
wherein the first semiconductor light emitting structure includes a bonding layer located between the common substrate and the epitaxial grown layer, the bonding layer bonding both the common substrate and the epitaxial grown layer together; and
wherein the bonding layer includes an ohmic electrode layer and a bonding material layer composed of a metal, and the ohmic electrode layer is formed in contact with the epitaxial grown layer.

Col. 15, lines 4-23 & Col. 16 lines 1-4 should read,

21. A method of manufacturing a composite semiconductor device, comprising:
forming an epitaxial grown layer including a light emitting layer on a grown substrate;
forming a first electrode on the epitaxial grown layer;
providing a common substrate having a top surface and a bottom surface;
forming a second electrode and a third electrode on the top surface and bottom surface of the common substrate, respectively;
bonding the first electrode and the second electrode together to form a bonded assembly;
forming a fourth electrode on a surface of the bonded assembly adjacent the epitaxial grown layer to form a first semiconductor light emitting structure;

Signed and Sealed this
Twenty-fifth Day of October, 2011

David J. Kappos
*Director of the United States Patent and Trademark Office* forming a notch at at least one location in the epitaxial grown layer in the first semiconductor light emitting structure extending to at least one of the first electrode, the second electrode, and the common substrate;

forming a fifth electrode on an inner bottom of the notch; and mounting a second semiconductor light emitting structure in the notch.